United States Patent
Mihajlovic et al.

(10) Patent No.: US 10,381,552 B2
(45) Date of Patent: Aug. 13, 2019

(54) SOT MRAM CELL WITH PERPENDICULAR FREE LAYER AND ITS CROSS-POINT ARRAY REALIZATION

(71) Applicant: HGST Netherlands B.V., Amsterdam (NL)

(72) Inventors: Goran Mihajlovic, San Jose, CA (US); Neil Smith, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/185,356

(22) Filed: Jun. 17, 2016

(65) Prior Publication Data

US 2017/0365777 A1    Dec. 21, 2017

(51) Int. Cl.
| H01L 43/04 | (2006.01) |
| H01L 43/08 | (2006.01) |
| H01L 43/06 | (2006.01) |
| H01L 43/10 | (2006.01) |

(52) U.S. Cl.
CPC ............ *H01L 43/04* (2013.01); *H01L 43/065* (2013.01); *H01L 43/08* (2013.01); *H01L 43/10* (2013.01)

(58) Field of Classification Search
None
See application file for complete search history.

(56) References Cited

U.S. PATENT DOCUMENTS

| 7,149,106 | B2 | 12/2006 | Mancoff et al. |
| 8,889,433 | B2 | 11/2014 | De Brosse et al. |
| 8,971,100 | B2 | 3/2015 | Zhou et al. |
| 9,105,832 | B2 | 8/2015 | Buhrman et al. |
| 2014/0269035 | A1 | 9/2014 | Manipatruni et al. |
| 2015/0200003 | A1* | 7/2015 | Buhrman ............... G11C 11/18 365/158 |

OTHER PUBLICATIONS

Wang, et al.; Journal of Physics D: Applied Physics; Low-Power Non-Volatile Spintronic Memory: STT-RAM and Beyond; dated Aug. 15, 2012; 10 total pages.
Van Den Brink, et al.; Applied Physics Letters 104; Spin-Hall-Assisted Magnetic Random Access Memory; dated Oct. 15, 2013; 4 total pages.

* cited by examiner

*Primary Examiner* — Jack S Chen
(74) *Attorney, Agent, or Firm* — Patterson & Sheridan, LLP; Steven Versteeg

(57) ABSTRACT

The present disclosure generally relates to a SOT-MRAM cell that has a spin Hall effect layer and a magnetic tunnel junction. The magnetic tunnel junction is disposed at an edge of the spin Hall effect layer. In order to write the cell, current is applied through the spin Hall effect layer to create spin accumulation of z-polarized spins under the free layer due to the spin Hall effect. The spins exert a spin torque on the free layer via spin diffusion. Based upon the design, the SOT-MRAM cell has deterministic switching of the perpendicular free layer with the spin Hall effect layer without application of an external magnetic field.

7 Claims, 8 Drawing Sheets

SOT MRAM CELL WITH PERPENDICULAR FREE LAYER AND ITS CROSS-POINT ARRAY REALIZATION

BACKGROUND OF THE DISCLOSURE

Field of the Disclosure

Embodiments of the present disclosure generally relate to magnetic storage elements, and more particularly to memory cells in a magnetoresistive random-access memory device (MRAM).

Description of the Related Art

MRAM is a non-volatile random-access memory technology. Unlike conventional RAM, data in MRAM devices are not stored as electric charge or current flows. Instead, data is stored as magnetization direction of magnetic storage elements. Magnetic tunnel junction MRAM devices include cells or elements having a magnetically hard layer (i.e., a "reference" layer), a magnetically soft layer (i.e., the "free" layer), and a tunnel junction layer between the two, together forming a magnetic tunnel junction (MTJ) device. The electrical resistance of the MTJ is a strong function of the relative orientation of the reference and free-layer magnetization, being minimum (or maximum) when the free-layer magnetization orientation is parallel (or antiparallel) to that of the (fixed) reference layer. Writing to MRAM is performed by passing current through current leads that are formed on either side of each memory element in order to create a local induced magnetic field, which sets the direction of the (bi-stable) free layer magnetization parallel or antiparallel to that of the reference layer. Significant problems arise when scaling these devices to high densities. Particularly, the currents required to generate sufficient field to switch the free layer become prohibitively large, and disturbances to neighboring cells or elements can occur during writing, which in turn may cause a neighboring cell to be erroneously written.

Spin transfer torque (STT) MRAM devices are similar to conventional MRAM devices except that the write current path passes through the MTJ, in a direction perpendicular to the plane of the film layers comprising the MTJ device. The free layer magnetization direction is set via the spin transfer torque from the spin polarized current passing through the device. The spin-polarization direction of this current is primarily collinear with that the nominal (collinear) free and reference layer magnetization directions.

Spin orbit torque (SOT) MRAM devices are similar to STT-MRAM devices except that the read and write paths are independent. This is achieved by adding another layer of material with strong spin orbit coupling next to (typically just below) the free-layer of the MTJ. The effective spin torque field on the free magnetic layer is then generated via one of the spin orbit coupling mechanisms such as spin-Hall-effect (SHE) or Rashba-Edelstein effect, by passing electrical charge current ("write" current) through the spin orbit coupling layer. Because the in-plane write current does not flow in a perpendicular direction into (and pass through) the MTJ (which over time can damage the tunnel barrier layer), SOT-MRAM devices can have better endurance and reliability.

For SOT-MRAM devices based on SHE, the (in-plane) flow direction of the write current in the (nonmagnetic) SHE-layer generates a second flow of pure spin current (i.e., no net electrical change current) in an orthogonal direction, the spin-polarization direction of the spin-current being mutually orthogonal to both aforementioned flow directions. It is the perpendicular-to-plane flow of this polarized pure spin-current into the free-layer that allows the completion of the write process (i.e., flipping direction of the free-layer magnetization) with essentially zero charge current through (or voltage drop across) the tunnel barrier. However, from the above description, the polarization direction of the SHE-generated pure spin-current flowing into the free-layer will not have a component that is perpendicular to the plane of the free-layer film. Since it is the collinear (to free-layer magnetization) component of the polarization of the (injected) spin-current which is most efficient for facilitating deterministic switching of the free-layer magnetization (and without requiring additional external fields) this "conventional" SHE-MRAM design is by far most effective for MTJ devices with in-plane magnetized free-layers designs.

However, when pushing storage density for MRAM, STT-MRAM cell designs with perpendicularly magnetized MTJ designs show the most promise for reducing physical diameter of the MTJ pillar, and in turn beneficially reducing write current requirements at fixed write current density (or write voltage) However, as alluded to previously, perpendicular STT-MRAM will still require potentially damaging write current through (or write voltage across) the tunnel barrier.

As high density nonvolatile memory devices become increasingly more popular in diverse applications, there is a continual need for improved MRAM devices. Thus, what is needed is an improved SOT-MRAM device that is practically implementable using magnetically perpendicular MTJ memory cells without need for additional external bias fields.

SUMMARY OF THE DISCLOSURE

The present disclosure generally relates to a SOT-MRAM cell that has a spin-Hall-effect layer (SHE-layer) and an MTJ memory cell with perpendicular (to film plane) orientation of the magnetization of the free-layer. The MTJ is disposed at an edge of the SHE-layer. In order to write the cell, write current is applied through the SHE-layer (taken here to run along the x-axis), which via the SHE creates a y-axis flow of z-polarized spin-current, creating an accumulation of z-polarized spins at/near either y-edge of the SHE-layer. For an MTJ disposed along either (y-)edge rather than at the center of the SHE layer, some of the accumulated z-polarized spins flow will into the free-layer via spin diffusion, and exert a spin torque on the free layer, analogously to what occurs for perpendicular STT-MRAM. Based upon the design, this SOT-MRAM cell can allow for deterministic switching of a perpendicularly magnetized free layer without application of an external magnetic field.

In one embodiment, a SOT-MRAM cell is disclosed. The cell comprises a nonmagnetic spin Hall effect layer; and a magnetic tunnel junction disposed adjacent an edge of the nonmagnetic spin Hall effect layer.

In another embodiment, a memory array is disclosed. The array comprises a plurality of rows of spin Hall effect lines (SHE-lines), wherein each row of spin Hall effect lines has two transistors coupled thereto; a plurality of columns of bitlines, wherein each column of bitlines has a transistor coupled thereto; and a plurality of magnetic tunnel junctions, wherein a magnetic tunnel junction is disposed at an intersection of a SHE-line and a bitline, and wherein at least one magnetic tunnel junction is disposed adjacent an edge of an SHE-line of the plurality of SHE-lines.

In another embodiment, a memory array comprises a plurality of rows of spin Hall effect lines, wherein each row of spin Hall effect lines has two transistors coupled thereto; a plurality of columns of bitlines, wherein each column of bitlines has a transistor coupled thereto; a plurality of first magnetic tunnel junctions, wherein at least one first magnetic tunnel junction is disposed adjacent a first edge of a spin Hall effect line of the plurality of spin Hall effect lines; and a plurality of second magnetic tunnel junctions, wherein at least one second magnetic tunnel junction is disposed adjacent a second edge of a spin Hall effect line of the plurality of spin Hall effect lines, and wherein each magnetic tunnel junction of the plurality of first and second magnetic tunnel junctions is disposed at an intersection of a spin Hall effect line and a bitline.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a SOT-MRAM cell that has a spin-Hall-effect layer (SHE-layer) and an MTJ memory cell with perpendicular (to film plane) orientation of the magnetization of the free-layer. The MTJ is disposed at an edge of the SHE-layer. In order to write the cell, write current is applied through the SHE-layer (taken here to run along the x-axis), which via the SHE creates a y-axis flow of z-polarized spin-current, creating an accumulation of z-polarized spins at/near either y-edge of the SHE-layer. For an MTJ disposed along either (y-)edge rather than at the center of the SHE layer, the accumulated z-polarized spins flow will into the free-layer via spin diffusion, and exert a spin torque on the free layer. Based upon the design, this SOT-MRAM cell can allow for deterministic switching of a perpendicularly magnetized free layer without application of an external magnetic field.

Figure 1:
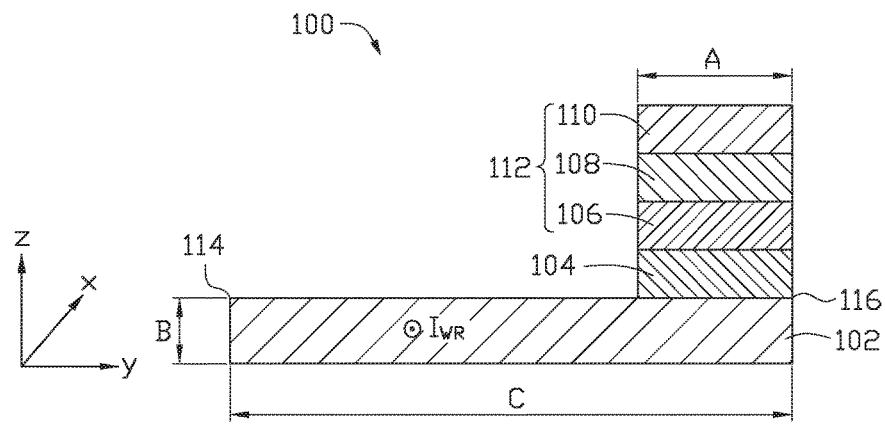
FIG. 1 is a schematic cross-sectional illustration of a SOT-MRAM cell according to one embodiment.

FIG. 1 is a schematic cross-sectional illustration of a SOT-MRAM cell 100 according to one embodiment. The cell 100 includes a spin Hall effect layer 102, a spacer layer 104 and a magnetic tunnel junction 112. The magnetic tunnel junction 112 comprises a free magnetic layer 106 (i.e., free layer), a tunnel barrier layer 108 and a reference magnetic layer 110 (i.e., reference layer). The write current for writing the cell 100 is shown as $I_{WR}$ which flows through the spin Hall effect layer 102 in the x-direction. The spin Hall effect layer 102 generates a perpendicularly polarized spin accumulation layer below the free layer 106 that will exert torque on the free layer 106. The spacer layer 104, while shown in FIG. 1, may or may not be present. Thus, while the remaining Figures in the disclosure do not show a spacer layer, it is to be understood that a spacer layer may or may not be present in all embodiments discussed herein. The spin diffusion length in the spin Hall effect layer 102 should be on the order of the magnetic tunnel junction 112 diameter, which is denoted as "A". The thickness of the spin Hall effect layer 102, which is denoted by "B" should be less than the spin diffusion length in the spin Hall effect layer 102.

The spin Hall effect layer 102 is positioned beneath the free layer 106, and, in one embodiment, may be in contact with the free layer 106. The spin Hall effect layer 102 comprises a material that is not magnetic and exhibits substantial spin Hall effect. The spin Hall effect is a transport phenomenon in a nonmagnetic conductor consisting of the generation of spin current flow in a direction perpendicular to the plane defined by electrical current direction and that of the spin polarization direction. This spin current results in build-up of spin accumulation at the edges of the conductor that are parallel to the plane defined by electrical current direction and that of the spin polarization direction. The write current flowing in the x-direction inside the spin Hall effect layer 102 generates a spin current of z-polarization that flows in the lateral y-direction inside spin Hall effect layer 102, resulting in build-up of spin accumulation of z-polarized spins of opposite orientations at the edges 114 and 116. The spin Hall effect layer 102 may be formed from, for example, Pt, Ta, W, or copper doped with either bismuth or iridium, or combinations thereof.

As can be seen in FIG. 1, the spin Hall effect layer 102 has a width denoted as "C", a first edge 114 and a second edge 116. The magnetic tunnel junction 112 is disposed at the second edge 116 in FIG. 1, but it is to be understood that the magnetic tunnel junction 112 may be positioned at the first edge 114.

Figure 2:
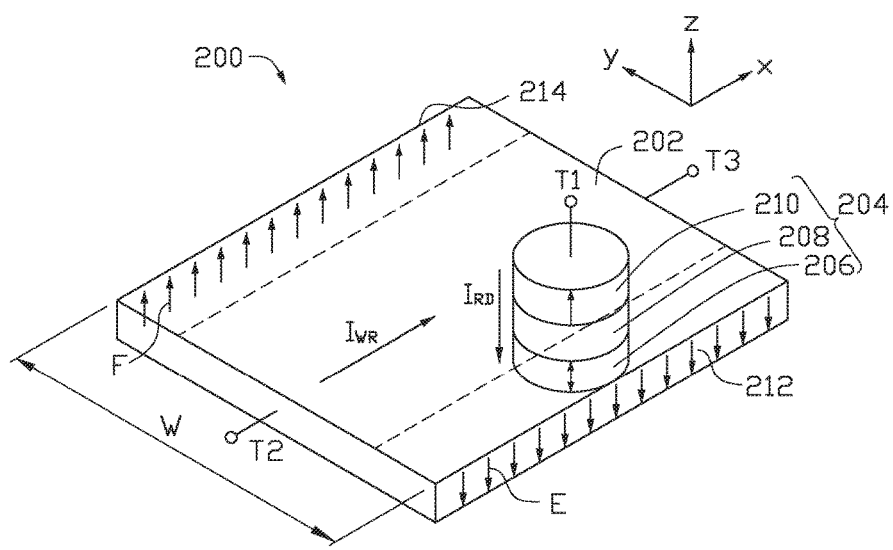
FIG. 2 is a schematic isometric illustration of a SOT-MRAM cell according to another embodiment.

FIG. 2 is a schematic isometric illustration of a SOT-MRAM cell 200 according to another embodiment. The cell 200 includes a spin Hall effect layer 202 and magnetic tunnel junction 204 which includes a free layer 206, tunnel barrier layer 208 and reference layer 210. The spin Hall effect layer 202 has a width denoted by "W". The ratio of the spin diffusion length of the spin Hall effect layer 202 to the diameter of the magnetic tunnel junction 204 may be between about ⅙ to about ½. The ratio of the thickness of the spin Hall effect layer 202 to the diameter of magnetic tunnel junction 204 may be between about 0.1-0.2. The ratio of the width of the spin Hall effect layer 202 to the diameter of the magnetic tunnel junction 204 may be between about 1 and about 2.5.

The magnetic tunnel junction 204 is disposed at an edge 212 of the spin Hall effect layer 202. It is to be understood that while the magnetic tunnel junction 204 is shown disposed at one edge 212, the magnetic tunnel junction 204 may alternatively be disposed at the other edge 214.

Three terminals $T_1$, $T_2$ and $T_3$ are present. In order to write, current $I_{WR}$ is applied through the spin Hall effect layer 202 from $T_2$ to $T_3$ to create spin accumulation of z-polarized spins under the free layer 206 due to the spin Hall effect. These spins exert spin torque on the free layer via spin-diffusion. Different polarities are used for the write current $I_{WR}$ to write 0 and 1 respectively, depending on the sign of the spin Hall effect in the spin Hall effect layer 202 and the magnetization orientation of the reference layer 210. For example, if reference layer 210 has its magnetization orientation in the positive z direction as shown in FIG. 2, and sign of the spin Hall effect in the spin Hall effect layer 202 is such that when $I_{WR}$ is run from $T_2$ to $T_3$ spin accumulation on the edge 212 is polarized in the negative z direction as shown in FIG. 2, then to write 0 (low R, free layer 206 parallel to the reference layer 210) $I_{WR}$ should be applied from $T_3$ to $T_2$. To write 1 (high R, free layer 206 antiparallel to the reference layer 210) $I_{WR}$ should be applied from $T_2$ to $T_3$. To read, current $I_{RD}$ is applied through the magnetic tunnel junction 204 from $T_1$ to $T_3$. By simultaneously applying an additional small current from $T_2$ to $T_3$ during reading, read-disturb events can be reduced or even eliminated. The polarity of small current from $T_2$ to $T_3$ should be chosen so that the spin orbit torque it generates on the free layer is subtracted from the spin transfer torque (STT) that is generated from the reference layer on the free layer while reading. For example, if $I_{RD}$ is applied from the reference layer to the free layer as shown in FIG. 2, then a small current should be applied from $T_3$ to $T_2$ so that the spin accumulation at the edge 212 is in positive z direction.

At the edges of the spin Hall effect layer 202, there is a perpendicular spin polarization as shown by the arrows "E" and "F". The spin polarizations are opposite to one another so that one edge 214 has a spin polarization in the positive z-direction (arrows "F" as shown) and the other edge 212 has a spin polarization in the negative z-direction (arrows "E" as shown). Depending on the spin Hall effect material, sign of the spin polarization at the given edge and for the given polarity of the current $I_{WR}$ can be either in positive or negative z direction, but is always opposite to that direction at the other edge. There is a gradual change of the magnitude of spin polarization from the center of the spin Hall effect layer 202 to the edges 212, 214, while the spin orientation has opposite signs left and right from the center. The width and the spin diffusion length of the spin Hall effect layer 202 affect the degree of the gradual change. Because the edges 212, 214 of the spin Hall effect layer 202 have perpendicular spin polarization, an external magnetic field is not needed to deterministically switch the free layer 206 of the cell 200.

Figure 3A:
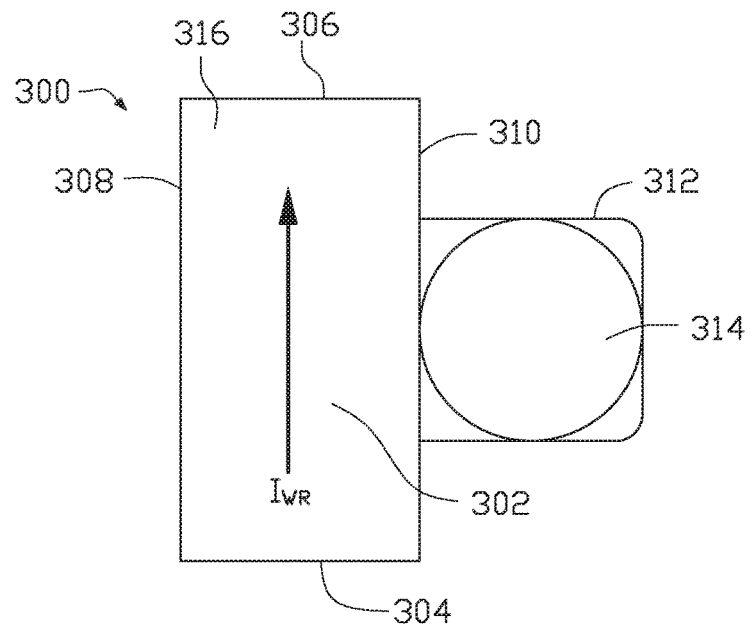
FIGS. 3A-3D are schematic top illustrations of SOT-MRAM cell arrangements according to various embodiments.

It is believed that the efficiency of SOT-MRAM cells can be improved not only by having the magnetic tunnel junction disposed at an edge of a spin Hall effect layer, but also by changing the geometry of the spin Hall effect layer itself. For example, it is only that portion of the write current in the SHE-line that does not flow directly beneath the MTJ cell that gives a net contribution to the SHE-generated pure spin-current entering the free-layer. Specifically, by having a "bump out" on an edge of the SHE-line, and placing the magnetic tunnel junction on the bump out portion, the write current is mostly constrained to flow in the channel of the SHE-line that lies to one side of the MTJ. Ideally, this could increase the write-efficiency by as much as a factor of 1/(1−A/W), where A is diameter of MTJ, and W is the total width of the SHE-line including bump-out portion. However, finite spin-diffusion length and partial distortion in the flow of the write/electrical current into the bump-out region will reduce the achievable efficiency gain from the cited idealized maximum. FIGS. 3A-3D are schematic top illustrations of SOT-MRAM cell arrangements according to various embodiments. As shown in FIG. 3A, the cell 300 includes a spin Hall effect layer 302 having a first end 304, a second end 306, a first edge 308 extending between the first end 304 and the second end 306, and a second edge 310 extending between the first end 304 and the second end 306. Write current $I_{WR}$ can be applied from the first end 304 to the second end 306. The second edge 310 has a bump out portion 312 upon which a magnetic tunnel junction 314 is disposed. In one embodiment, the bump out comprises different material with different resistivity and spin diffusion length than the main portion 316 of the spin Hall effect layer 302. The embodiment shown in FIG. 3A may be referred to as a T-shaped geometry.

Figure 3B:
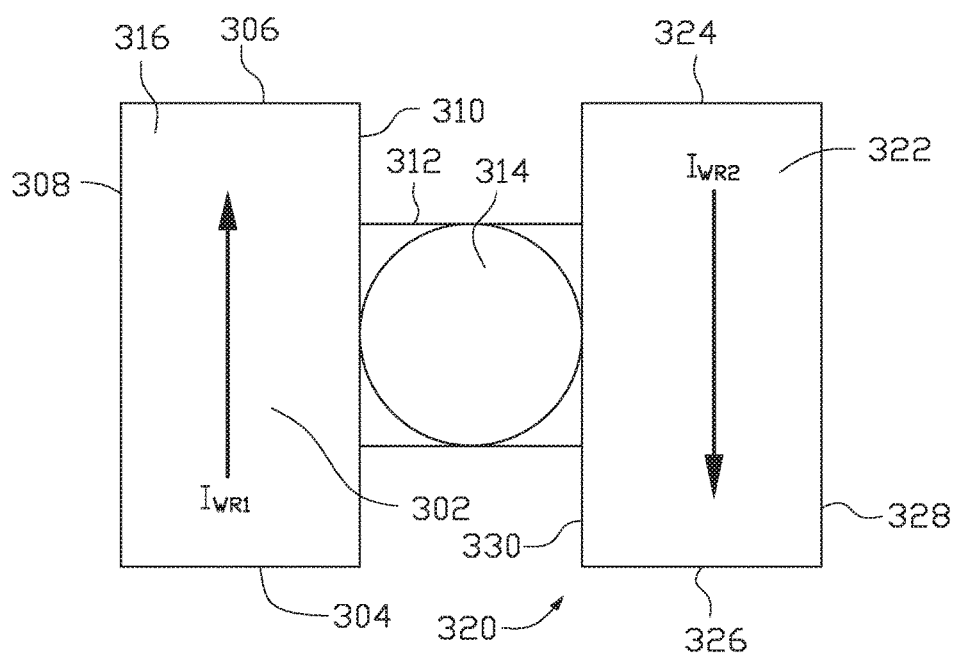

As shown in FIG. 3B, a cell 320 with an H-shaped geometry is also possible whereby the bump out portion 312 is disposed between the main portion 316 and a secondary portion 322. The secondary portion 322 also has a first end 324, second end 326, first edge 328 extending between the first end 324 and the second end 326, and a second edge 330 extending between the first end 324 and the second end 326. A second write current $I_{WR2}$ may be applied from the first end 324 to the second end 326 in addition to write current $I_{WR1}$ that is applied between the first end 304 and the second end 306. The bump out portion 312, the main portion 316 and secondary portion 322 may collectively be the same material. Alternatively, the bump out portion 312, main portion 316 and secondary portion 322 may comprise different materials. In still another embodiment, the main portion 316 and secondary portion 322 may comprise the same material, but the bump out portion 312 may comprise a different material. Depending on the materials and signs of the spin Hall effect in the spin Hall effect layers 316 and 322, polarity of currents $I_{WR1}$ and $I_{WR2}$ should be chosen as that spin orbit torques exerted by each of them on the free magnetic layer in magnetic tunnel junction 314 are added.

Figure 3C:
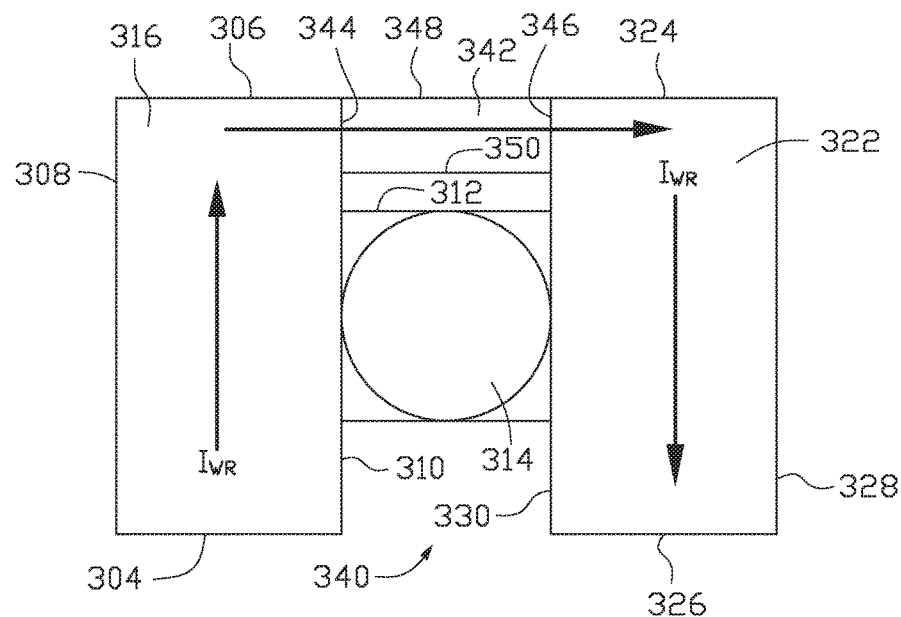

As shown in FIG. 3C, a cell 340 with an A-shaped geometry is also possible. In FIG. 3C, a tertiary portion 342 is added and extends between the second edge 310 of the main portion 316 and the second edge 330 of the secondary portion 322. The tertiary portion 342 has a first end 344, second end 346, first edge 348 extending between the first end 344 and second end 346, and a second edge 350 extending between the first end 344 and second end 346. Both the first edge 348 and the second edge 350 are spaced from the bump out portion 312. Due to the fact that the main portion 316, secondary portion 322 and tertiary portion 342 are all connected, a single write current $I_{WR}$ may be applied. Thus, the write current $I_{WR}$ travels from the first end 304 of the main portion 316 to the interface between the first end 344 of the tertiary portion 342, to the interface of the second end 346 of the tertiary portion and the second edge 330 of the secondary portion, and finally to the second end 326 of the secondary portion 322. Unlike FIG. 3B, it would be highly advantageous here if the bump out portion 312 be of much higher resistivity than portions 316, 322, and 342, so that little if any of the write current $I_{WR}$ will be shunted through the bump out portion 312 rather than flow through tertiary portion 342.

Figure 3D:
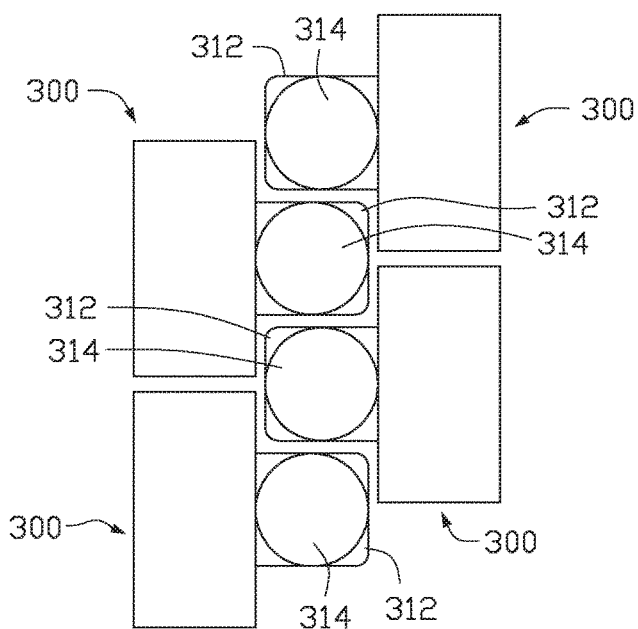

FIG. 3D shows four T-shaped cells arranged so that the bump outs 312, and thus magnetic tunnel junctions 314 are all linearly aligned. The stacked geometry shown in FIG. 3D reduces areal density losses.

Figure 4:
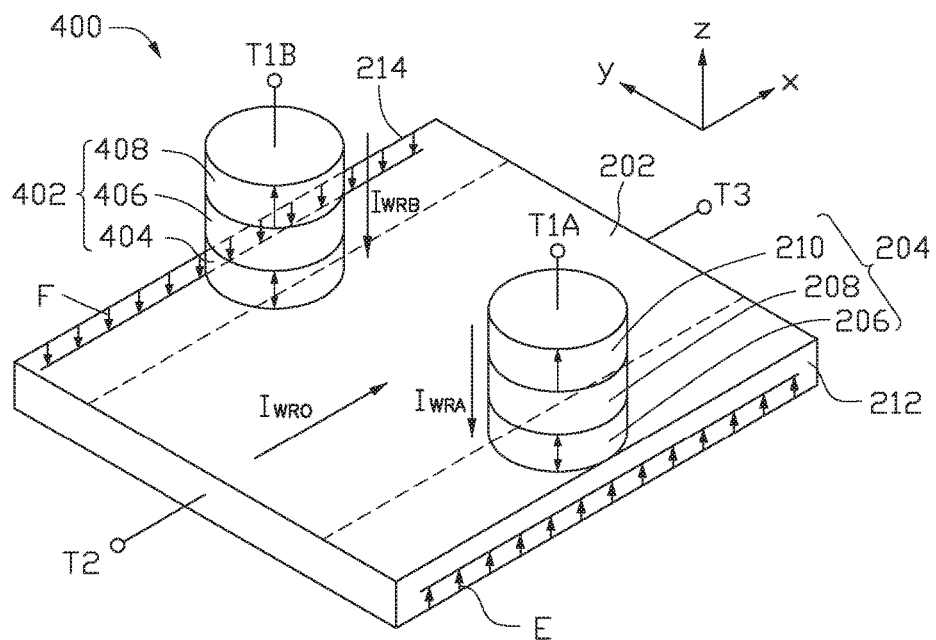
FIG. 4 is a schematic isometric illustration of a SOT-MRAM cell according to another embodiment.

It is contemplated that more than one magnetic tunnel junction may be present on a given spin Hall effect layer. In this case spin polarization generated by the spin Hall effect in the SHE layer assists spin transfer torque (STT) writing but is not strong enough to switch the magnetization of the free layer on its own. FIG. 4 is a schematic isometric illustration of a SOT-assisted STT-MRAM cell 400 according to another embodiment. In FIG. 4, a second magnetic tunnel junction 402 is disposed on edge 214. The second magnetic tunnel junction 402 includes a second free layer 404, a second tunnel barrier layer 406 and a second reference layer 408. The first reference layer 210 is coupled to a first terminal $T_{1A}$ while the second reference layer 408 is coupled to another terminal $T_{1B}$. The magnetic tunnel junctions 204, 402 are substantially identical and positioned on opposite edges of the spin Hall effect layer 202. By having two magnetic tunnel junctions 204, 402 on the same spin Hall effect layer 202, the areal density is increased.

An example writing sequence for the embodiment shown in FIG. 4 may proceed as follows. (It will be assumed that reference layers 210 and 408 all have their magnetization direction in the same positive z-direction.) Firstly, the current $I_{WR0}$ is applied from $T_2$ to $T_3$, resulting in the accumulation of positive z-polarized spins at/near edge 212, and negative z-polarized spins at/near edge 214. The spin-accumulations at/near edge 212 (or 214) will exert spin-torques on the bottom surface of free-layer 206 (or 404) which will favor and/or assist setting the magnetization of free-layer 206 (or 402) in the positive (or negative) direction, respectively. Simultaneously, current $I_{WRA}$ is applied from $T_2$ to $T_{1A}$, and current $I_{WRB}$ may be applied from $T_2$ to $T_{1B}$ such that positive z-polarized spins will (and possibly may) exert spin-transfer torque on the on the top surface of free-layer 206 (and possibly free-layer 404) which will favor and/or assist setting the magnetization of free-layer 206 (and possibly free-layer 404) in the positive direction. Provided it is only the constructive addition of the spin-torques on bottom and top surfaces of free-layers 206 and 404 which together become sufficient to cause the flipping of the free-layer magnetization (to the positive z-direction in this example), the above writing sequence will write/switch the magnetization of free-layer 206 only, and not free-layer 404. The possible application of $I_{WRB}$ in this example further guards against the "half-select" problem by deliberately resulting in destructive subtraction of the spin-torques on top and bottom surfaces of free-layer 404. By choosing the directions (polarities) of currents $I_{WR0}$ and $I_{WRA}$ (and/or $I_{WRB}$) either free-layer 206 or 404 may be individually written/switched to either the positive or negative z-direction, and with lower amplitudes of $I_{WRA}$ (and/or $I_{WRB}$) that would be required in the absence of $I_{WR0}$.

Figure 5A:
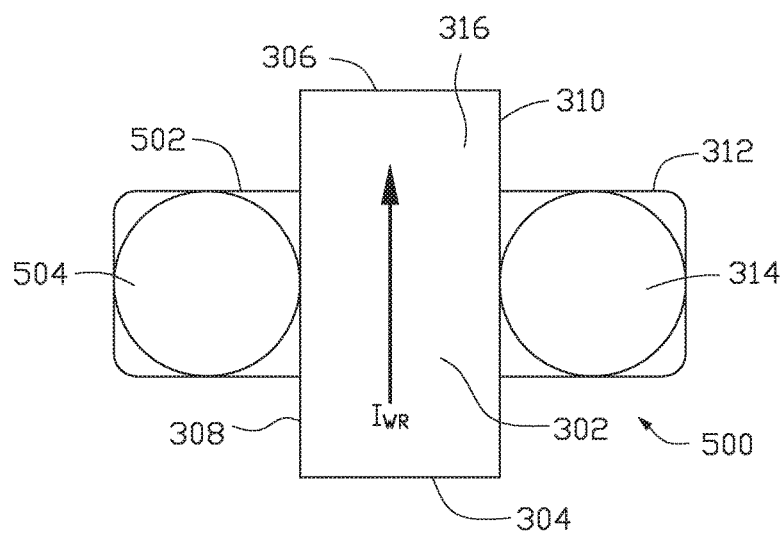
FIGS. 5A and 5B are schematic top illustrations of SOT-MRAM cells according to various embodiments.
Figure 5B:
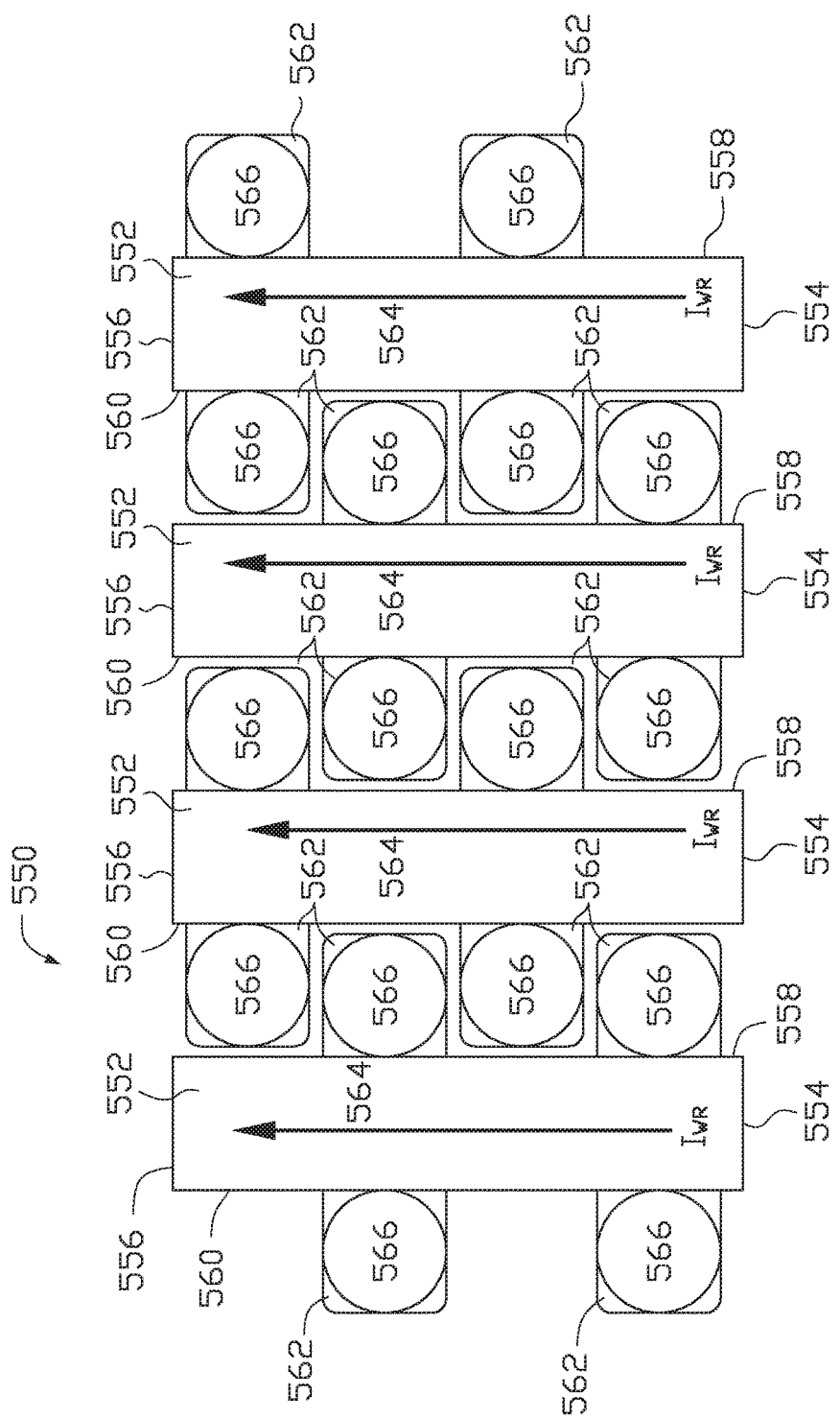

Similar to when a single magnetic tunnel junction is present on a single spin Hall effect layer, when 2 magnetic tunnel junctions are present on a single spin Hall effect layer, additional geometries are possible. FIGS. 5A and 5B are schematic top illustrations of SOT-MRAM cells according to various embodiments. FIG. 5A is similar to FIG. 3A except that the cell 500 includes a second bump out 502 with a second magnetic tunnel junction 504 disposed thereon. The second bump out 502 extends from the first side 308. Similar to FIG. 3A, the bump outs 312, 502 may comprise the same material or different material than the main portion 316.

FIG. 5B shows how multiple cells 550 may be arranged with multiple spin Hall effect layers 552 that each have first ends 554, second ends 556, first edges 558 extending between the first ends 554 and second ends 556, and second edges 560 extending between the first ends 554 and second ends 556. Bump outs 562 extend from the main portions 564 of the spin Hall effect layers 552 on both the first edges 558 and the second edges 560 with a magnetic tunnel junction 566 disposed in each bump out 562. As discussed above, the bump outs 562 may comprise the same material or different material than the main portions 564. Furthermore, the main portions 564 may all comprise the same material or different material. Additionally, the bump outs 562 may all comprise the same material or different material.

Figure 6:
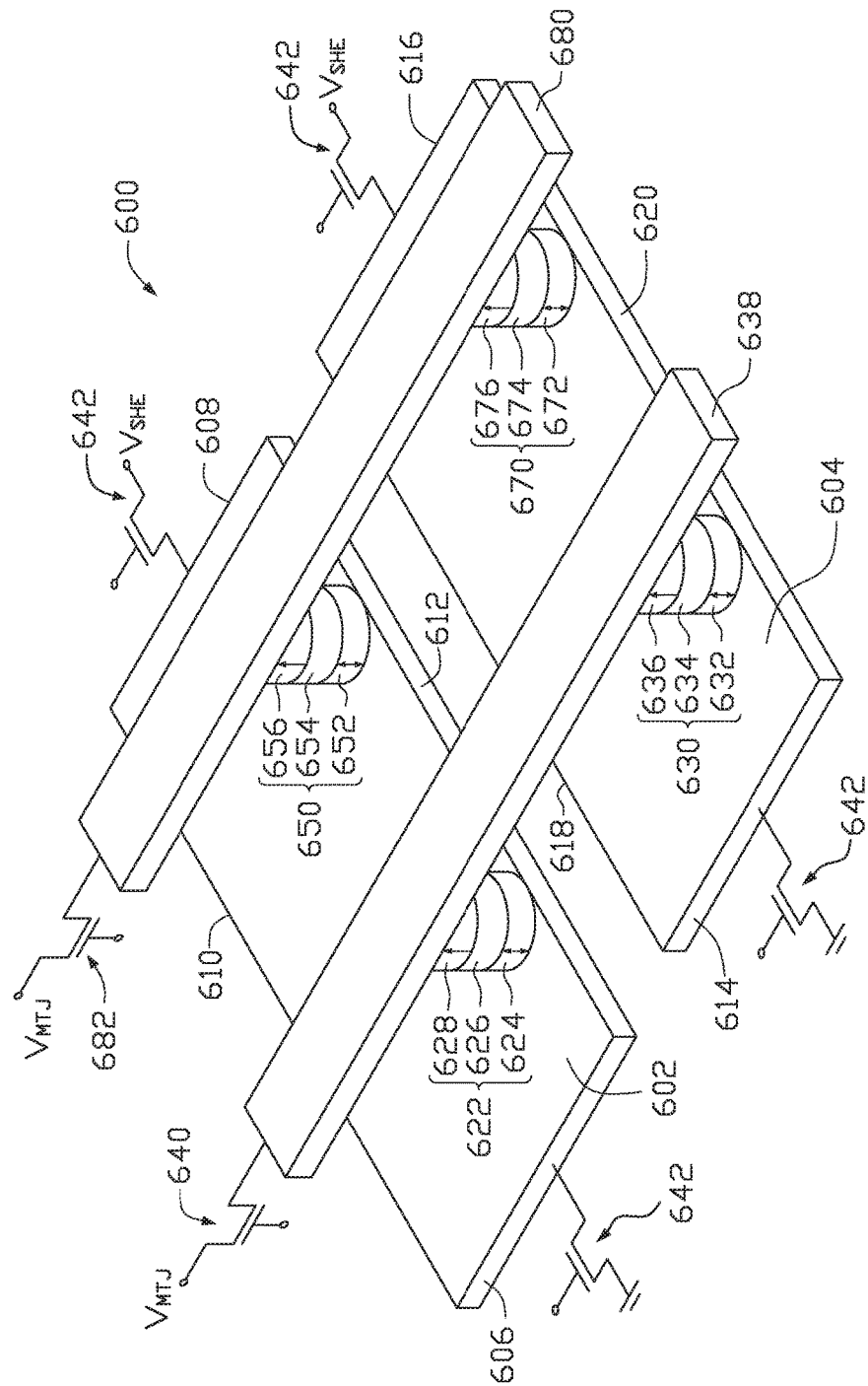
FIGS. 6-8 are schematic isometric illustrations of segments of memory arrays utilizing SOT-MRAM cells according to various embodiments.
Figure 7:
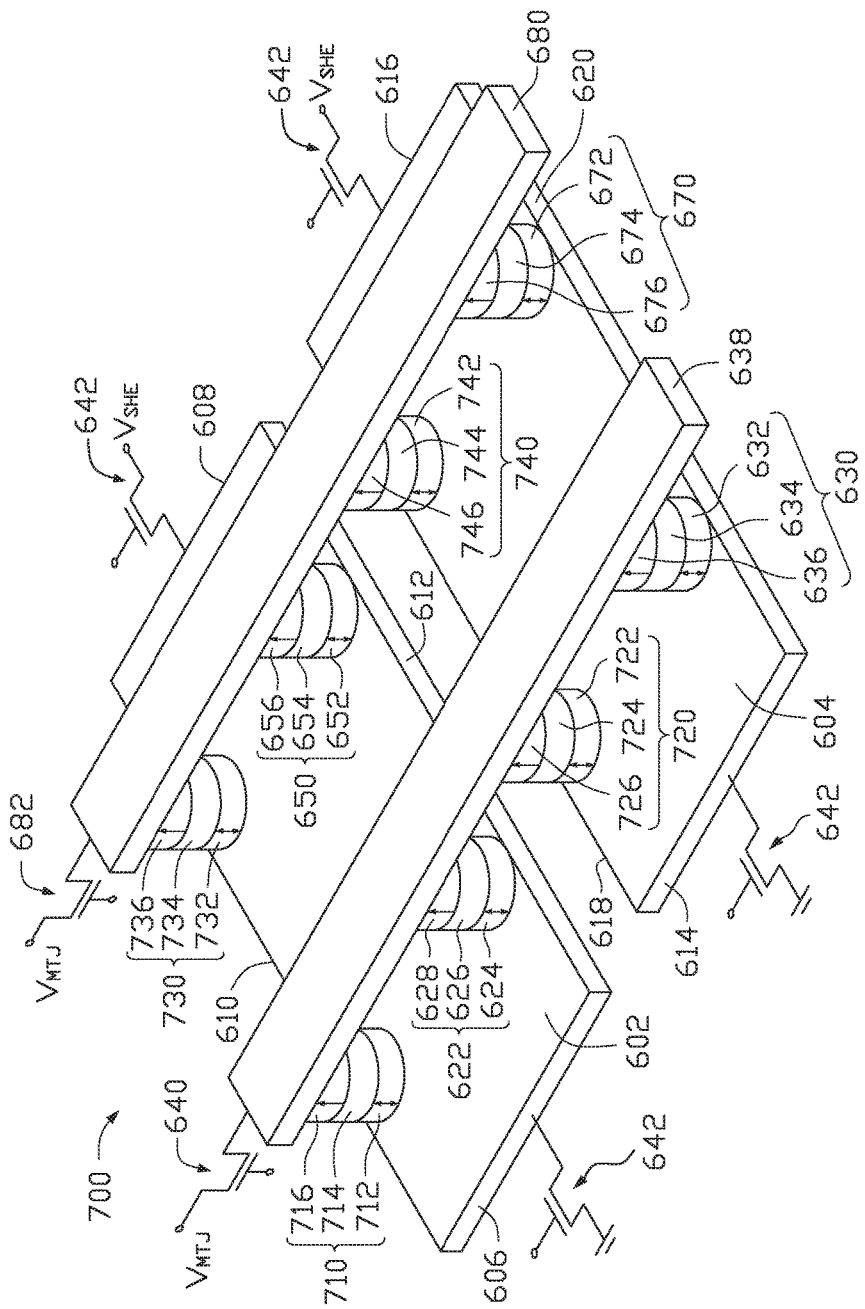
Figure 8:
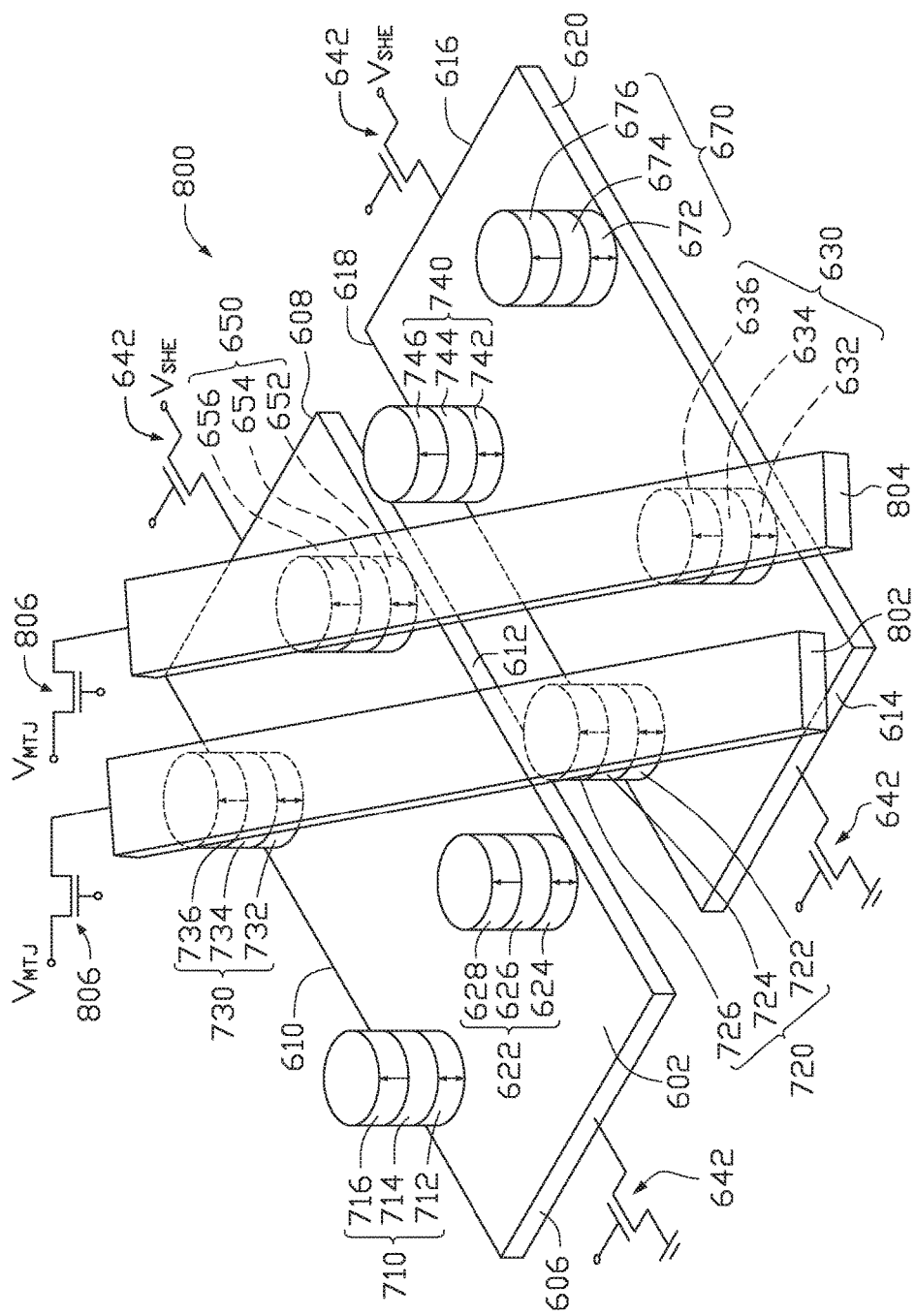

FIGS. 6-8 are schematic isometric illustrations of segments of memory arrays utilizing SOT-MRAM cells according to various embodiments. It is to be understood that the embodiments shown in FIGS. 6-8 are merely representative segments of the memory arrays rather than the entire memory array structure. For example, in FIG. 6, two spin Hall effect layers and two bitlines are shown. Also, four magnetic tunnel junctions are shown in FIG. 6. It is to be understood that the entire array may comprise numerous bitlines, numerous spin Hall effect layers and numerous magnetic tunnel junctions. The relatively small amount of bitlines, spin Hall effect layers and magnetic tunnel junctions are merely for brevity and clarity to understand the arrangement of the elements. The entire array may be greater than the 2×2 array shown in FIG. 6. For example, the entire array may be 8×8 or 64×64. Stated another way, the embodiment shown in FIG. 6 is merely an example of an array segment and not intended to limit the disclosure to a 2×2 memory array. Similarly for FIGS. 7 and 8, the segments shown include a 2×2 array with 8 magnetic tunnel junctions, but it is to be understood that the entire array may be 8×8 or even 64×64 or some other size array. Stated another way, the embodiments shown in FIGS. 7 and 8 are merely examples of array segments and not intended to limit the disclosure to a 2×2 memory array.

FIG. 6 shows a segment of memory array 600 wherein a first spin Hall effect layer 602 and second spin Hall effect layer 604 are present. The first spin Hall effect layer 602 includes a first end 606, second end 608, first edge 610 extending from the first end 606 to the second end 608, and a second edge 612 extending from the first end 606 to the second end 608. The second spin Hall effect layer 604 includes a third end 614, fourth end 616, third edge 618 extending between the third end 614 and fourth end 616, and fourth edge 620 extending between the third end 614 and fourth end 616. A first magnetic tunnel junction 622 is disposed on the second edge 612 of the first spin Hall effect layer 602. The first magnetic tunnel junction 622 includes a first free layer 624, a first tunnel barrier layer 626 and a first reference layer 628. A second magnetic tunnel junction 630 is disposed on the fourth edge 620 of the second spin Hall effect layer 604. The second magnetic tunnel junction 630 includes a second free layer 632, a second tunnel barrier layer 634 and a second reference layer 636. A first bitline 638 is coupled to the first reference layer 628 and the second reference layer 636. The first bitline 638 has a first transistor 640 coupled to one end and, while in a different plane than the first and second spin Hall effect layers 602, 604, extends substantially perpendicular to both the first and second spin Hall effect layers 602, 604. Both the first spin Hall effect layer 602 and the second spin Hall effect layer 604 have transistors 642 at one end 606, 614 and the other end 608, 616.

A third magnetic tunnel junction 650 is also present in the second edge 612 of the first spin Hall effect layer 602. The third magnetic tunnel junction 650 includes a third free layer 652, a third tunnel barrier layer 654 and a third reference layer 656. A fourth magnetic tunnel junction 670 is also present on the fourth edge 620 of the second spin Hall effect layer 604. The fourth magnetic tunnel junction 670 includes a fourth free layer 672, a fourth tunnel barrier layer 674 and a fourth reference layer 676. A second bitline 680 is coupled to the third reference layer 656 and the fourth reference layer 676. A single transistor 682 is coupled to the second bitline 680. Similar to the first bitline 638, the second bitline 680 extends substantially perpendicular to both the first and second spin Hall effect layers 602, 604 even though the second bitline 680 is in a different plane than the spin Hall effect layers 602, 604. Furthermore, the first and second bitlines 638, 680 may be disposed in a common plane while the first and second spin Hall effect layers 602, 604 may be disposed in a common plane that is separate from the common plane of the bitlines 638, 680.

For a single-bit writing operation, the transistor at the chosen column and pair of transistors at the two ends of the chosen row are set to ON, while all other transistors are set to OFF. The polarity of $V_{MTJ}$ and $V_{SHE}$ are chosen to be either positive or negative depending on whether 0 or 1 needs to be written and the sign of the spin Hall effect in the SHE layer rows. For single-bit reading, the transistors for the chosen column and the transistor at the grounded end of the chosen row are set to be ON. All of the other transistors are set to be OFF. For parallel reading of all bits in the chosen row, all of the column lines are set at the same voltage level $V_{MTJ}=V_{RD}$. Information is read in a parallel way from all the MTJs on the same row by measuring the currents flowing in the column lines.

In the embodiment shown in FIG. 7, additional magnetic tunnel junctions may be present in a segment of a memory array 700 as well. As shown in FIG. 7, a fifth magnetic tunnel junction 710 is disposed on the first edge 610 of the first spin Hall effect layer 602. The fifth magnetic tunnel junction 710 includes a fifth free layer 712, a fifth tunnel barrier layer 714 and a fifth reference layer 716. A sixth magnetic tunnel junction 720 is disposed on the third edge 618 of the second spin Hall effect layer 604. The sixth magnetic tunnel junction 720 includes a sixth free layer 722, a sixth tunnel barrier layer 724 and a sixth reference layer 726. A seventh magnetic tunnel junction 730 is disposed on the first edge 610 of the first spin Hall effect layer 602. The seventh magnetic tunnel junction 730 includes a seventh free layer 732, a seventh tunnel barrier layer 734 and a seventh reference layer 736. An eighth magnetic tunnel junction 740 is disposed on the third edge 618 of the second spin Hall effect layer 604. The eighth magnetic tunnel junction 740 includes an eighth free layer 742, an eighth tunnel barrier layer 744 and an eighth reference layer 746. The first, second, fifth and sixth reference layers 628, 636, 716, 726 are all coupled to the first bitline 638 while the third, fourth, seventh and eighth reference layers 656, 676, 736, 746 are all coupled to the second bitline 680.

FIG. 8 shows an arrangement where the segment of the memory array 800 includes bitlines 802, 804 that are arranged differently than in FIG. 7. Each bitline 802, 804 has a single transistor 806 coupled thereto. As compared to FIG. 7, however, the bitlines 802, 804 are not perpendicular to the first and second spin Hall effect layers 602, 604. Rather, assuming the current $I_{SHE}$ flows from the first side 606 (or third side 614) to the second side 608 (or fourth side 616), the bitlines 802, 804 are arranged so that the bitlines are coupled to reference layers on the same edges of the SHE layers relative to the current flow. For example, the first bitline 802 is coupled to the seventh reference layer 736 and the sixth reference layer 726. Both the seventh magnetic tunnel junction 730 and the sixth magnetic tunnel junction 720 are disposed on the respective "left" edges 610, 618 of the respective spin Hall effect layers 602, 604, based upon the current path. Similarly, the second bitline 804 is coupled to the third reference layer 654 and the second reference layer 636. Both the third magnetic tunnel junction 650 and the second magnetic tunnel junction 630 are disposed on the respective "right" edges 612, 620 of the respective spin Hall effect layers 602, 604, based upon the current path.

By disposing the magnetic tunnel junction on an edge of a spin Hall effect layer, an external magnetic field is not needed and deterministic switching of the free layer in a SOT-MRAM device may be obtained both effectively and efficiently.

While the foregoing is directed to embodiments of the present disclosure, other and further embodiments of the disclosure may be devised without departing from the basic scope thereof, and the scope thereof is determined by the claims that follow.

What is claimed is:
1. A memory array, comprising:
a plurality of rows of spin Hall effect lines, wherein each row of spin Hall effect lines has two transistors coupled thereto;
a plurality of columns of bitlines, wherein each column of bitlines has a transistor coupled thereto; and
a spin Hall effect layer having a first end, a second end, a first edge, and a second edge, wherein the first end of the spin Hall effect layer is parallel to the second end of the spin Hall effect layer, wherein both the first end and the second end are perpendicularly coupled to the first edge and the second edge, wherein a magnetic tunnel junction is disposed at an intersection of a spin Hall effect line and a bitline, and wherein at least one magnetic tunnel junction is disposed adjacent the first edge of the spin Hall effect layer and spaced from the second edge, the first end, and second end of the spin Hall effect layer, wherein the first edge, the second edge, the first end, and the second end are on a common plane, wherein a ratio of a spin diffusion length of the spin Hall effect layer to a diameter of the at least one magnetic tunnel junction is between ⅙ to ½, wherein the ratio of the thickness of the spin Hall effect layer to the diameter of the magnetic tunnel junction is between 0.1 to 0.2, and wherein the ratio width of the spin Hall effect layer to the diameter of the magnetic tunnel junction is 1 to 2.5, wherein the memory array is a spin orbit torque magnetoresistive random-access memory.

2. The memory array of claim 1, wherein the array does not have an external magnetic field coupled thereto.

3. The memory array of claim 1, wherein the spin Hall effect lines are formed from Pt, Ta, W, or copper doped with either bismuth or iridium, or combinations thereof.

4. The memory array of claim 1, further comprising a spacer layer coupled to each magnetic tunnel junction.

5. The memory array of claim 4, wherein each magnetic tunnel junction comprises:
- a free layer having primarily two bi-stable magnetization directions, wherein the free layer is disposed on the spacer layer;
- a reference layer having a fixed magnetization direction; and
- an insulating tunnel barrier layer positioned between the free layer and the reference layer.

6. The memory array of claim 1, wherein the edge comprises a bump-out portion.

7. The memory array of claim 6, wherein the at least one magnetic tunnel junction is coupled to the bump-out portion.

* * * * *